(12) United States Patent
Liao et al.

(10) Patent No.: US 11,349,046 B2
(45) Date of Patent: May 31, 2022

(54) LED CHIP STRUCTURE, CHIP TRANSFERRING SYSTEM AND CHIP TRANSFERRING METHOD

(71) Applicant: ASTI GLOBAL INC., TAIWAN, Taichung (TW)

(72) Inventors: Chien-Shou Liao, New Taipei (TW); Te-Fu Chang, Taichung (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 147 days.

(21) Appl. No.: 17/027,877

(22) Filed: Sep. 22, 2020

(65) Prior Publication Data
US 2021/0320222 A1   Oct. 14, 2021

(30) Foreign Application Priority Data
Apr. 8, 2020   (TW) .................................. 109111734

(51) Int. Cl.
*H01L 33/00*   (2010.01)
*H01L 33/62*   (2010.01)

(52) U.S. Cl.
CPC .......... *H01L 33/0095* (2013.01); *H01L 33/62* (2013.01)

(58) Field of Classification Search
CPC ............... H01L 33/0095; H01L 33/62; H01L 2221/68322; H01L 2221/68354; H01L 2221/68381; H01L 2933/0066; H01L 21/6835; H01L 33/38; H01L 25/0753; H01L 21/67742; H01L 21/67766
See application file for complete search history.

(56) References Cited

U.S. PATENT DOCUMENTS

| | | | |
|---|---|---|---|
| 2019/0325790 A1* | 10/2019 | Park | G09F 9/33 |
| 2021/0005489 A1* | 1/2021 | Chen | B65G 47/92 |
| 2021/0005642 A1* | 1/2021 | Chen | H01L 27/1248 |
| 2021/0005775 A1* | 1/2021 | Chen | H01L 24/95 |
| 2021/0399164 A1* | 12/2021 | Liao | H01L 22/12 |

* cited by examiner

*Primary Examiner* — Victor A Mandala (57) ABSTRACT

An LED chip structure, a chip transferring system and a chip transferring method are provided. The chip transferring system includes a liquid receiving tank, an electromagnetic field generating module and a connection layer removing module. A plurality of LED chip structures are randomly distributed in the liquid substance of the liquid receiving tank. The electromagnetic field generating module movably is disposed inside or removed from the liquid receiving tank. The connection layer removing module is disposed above the circuit substrate. Each of the LED chip structures includes an LED chip, a removable connection layer and a magnetic material layer. The LED chip structure can be transferred from the liquid receiving tank onto a circuit substrate by the electromagnetic field generating module, and the magnetic material layer can be separated from the LED chip while the removable connection layer is removed by the connection layer removing module.

10 Claims, 10 Drawing Sheets

FIG. 13

LED CHIP STRUCTURE, CHIP TRANSFERRING SYSTEM AND CHIP TRANSFERRING METHOD

CROSS-REFERENCE TO RELATED PATENT APPLICATION

This application claims the benefit of priority to Taiwan Patent Application No. 109111734, filed on Apr. 8, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip structure, a chip transferring system and a chip transferring method, and more particularly to an LED chip structure, an LED chip transferring system and an LED chip transferring method.

BACKGROUND OF THE DISCLOSURE

A light-emitting diode (LED) chip can be transferred from a carrier to a printed circuit board by a nozzle, but the conventional LED chip transferring method still has room for improvement.

SUMMARY OF THE DISCLOSURE

In response to the above-referenced technical inadequacies, the present disclosure provides an LED chip structure, a chip transferring system and a chip transferring method.

In one aspect, the present disclosure provides an LED chip structure, including an LED chip, a removable connection layer and a magnetic material layer. The LED chip has two electrode contacts disposed on a top side thereof. The removable connection layer is disposed on a bottom side of the LED chip. The magnetic material layer is disposed on the removable connection layer. The removable connection layer is connected between the LED chip and the magnetic material layer, so that when the removable connection layer is removed, the magnetic material layer is separated from the LED chip.

In another aspect, the present disclosure provides a chip transferring system, including a liquid receiving tank, an electromagnetic field generating module and a connection layer removing module. The liquid receiving tank has a liquid substance disposed therein, and a plurality of LED chip structures are randomly distributed in the liquid substance of the liquid receiving tank. The electromagnetic field generating module is movably disposed inside the liquid receiving tank or removed from the liquid receiving tank. The electromagnetic field generating module includes a movable carrier board and a plurality of electromagnetic heads disposed on the movable carrier board, and the LED chip structure is transferred from the liquid receiving tank onto a circuit substrate by the electromagnetic field generating module. The connection layer removing module is disposed above the circuit substrate. Each of the LED chip structures includes an LED chip, a removable connection layer and a magnetic material layer, the LED chip has two electrode contacts disposed on a top side thereof, the removable connection layer is disposed on a bottom side of the LED chip, and the magnetic material layer is disposed on the removable connection layer.

In yet another aspect, the present disclosure provides a chip transferring method, including: randomly distributing a plurality of LED chip structures in a liquid substance of a liquid receiving tank, wherein each of the LED chip structures includes an LED chip, a magnetic material layer and a removable connection layer connected between the LED chip and the magnetic material layer; transferring the LED chip structure from the liquid receiving tank onto a circuit substrate by the electromagnetic field generating module; electrically connecting the LED chip to the circuit substrate; and then removing the removable connection layer by the connection layer removing module so as to separate the magnetic material layer from the LED chip.

Therefore, by virtue of "the removable connection layer being disposed on a bottom side of the LED chip" and "the magnetic material layer being disposed on the removable connection layer", the magnetic material layer can be separated from the LED chip while the removable connection layer is removed.

Furthermore, by virtue of "the LED chip structures being randomly distributed in the liquid substance of the liquid receiving tank", "the electromagnetic field generating module being movably disposed inside the liquid receiving tank or removed from the liquid receiving tank" and "the connection layer removing module being disposed above the circuit substrate", the LED chip structure can be transferred from the liquid receiving tank onto a circuit substrate by the electromagnetic field generating module, and the magnetic material layer can be separated from the LED chip while the removable connection layer is removed by the connection layer removing module.

Furthermore, by virtue of "randomly distributing a plurality of LED chip structures in a liquid substance of a liquid receiving tank", "transferring the LED chip structure from the liquid receiving tank onto a circuit substrate by the electromagnetic field generating module", "electrically connecting the LED chip to the circuit substrate" and "removing the removable connection layer by the connection layer removing module so as to separate the magnetic material layer from the LED chip", the LED chip structure can be transferred from the liquid receiving tank onto a circuit substrate by the electromagnetic field generating module, and the magnetic material layer can be separated from the LED chip while the removable connection layer is removed by the connection layer removing module.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
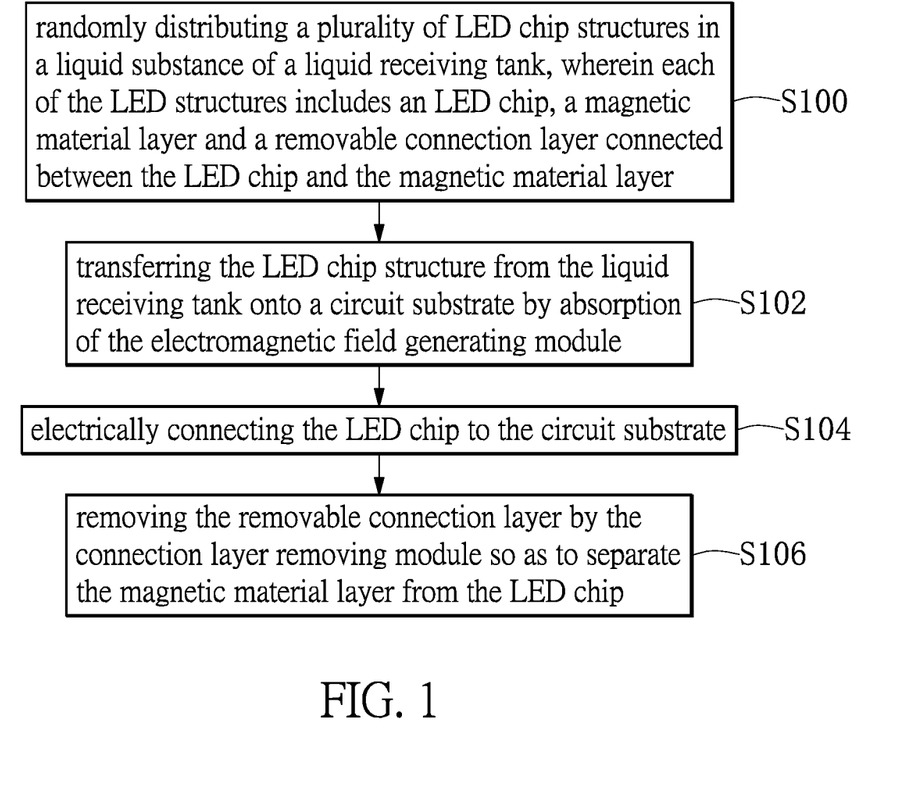
FIG. 1 is a flowchart of a chip transferring method according to a first embodiment of the present disclosure.
Figure 2:
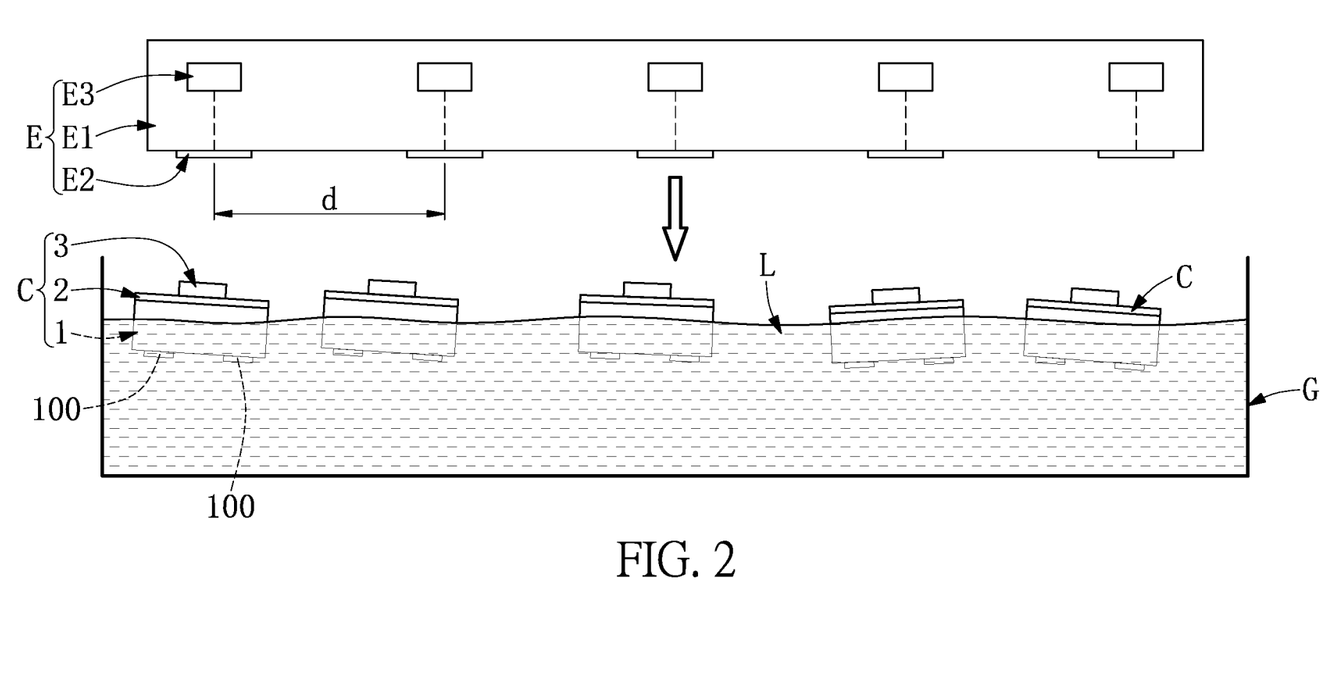
FIG. 2 is a schematic view of a step S100 of the chip transferring method according to the first embodiment of the present disclosure.
Figure 8:
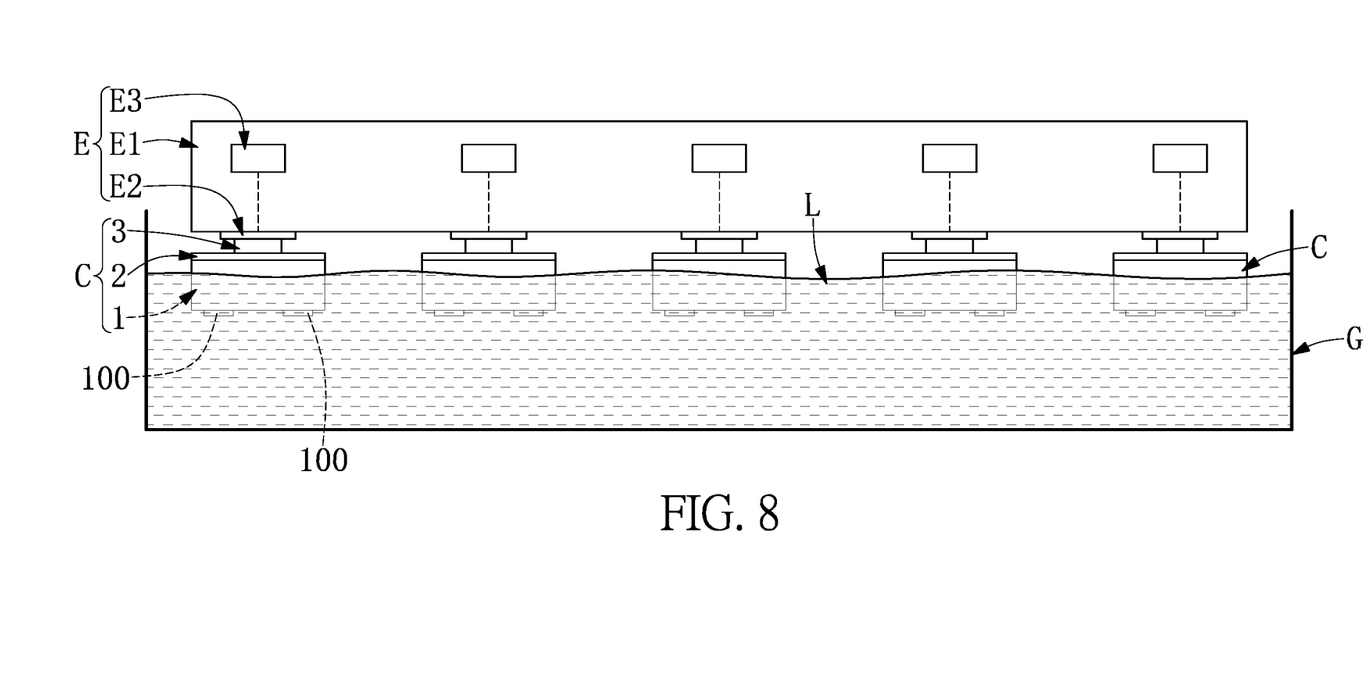
FIG. 8 is a top schematic view of the electromagnetic field generating module being disposed inside a liquid receiving tank for capturing or absorbing the LED chip structure according to the present disclosure.
Figure 9:
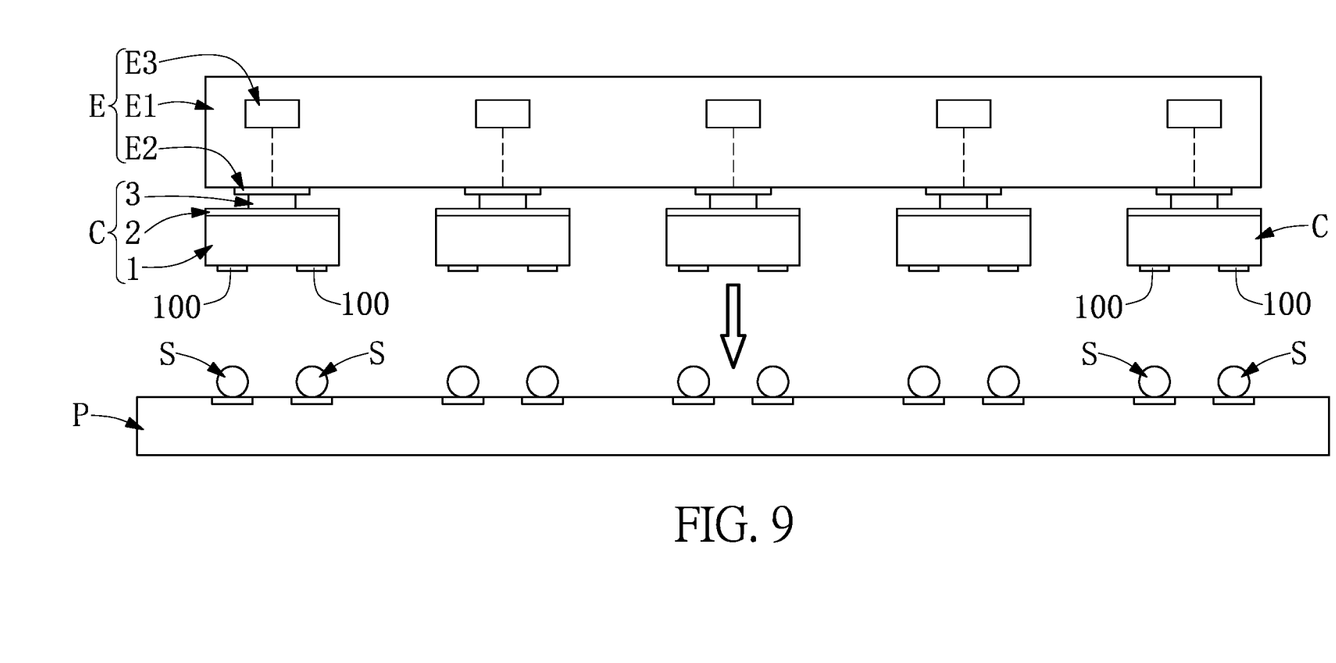
FIG. 9 is a top schematic view of the LED chip structure being transferred from the liquid receiving tank onto a circuit substrate by the electromagnetic field generating module according to the present disclosure.
Figure 10:
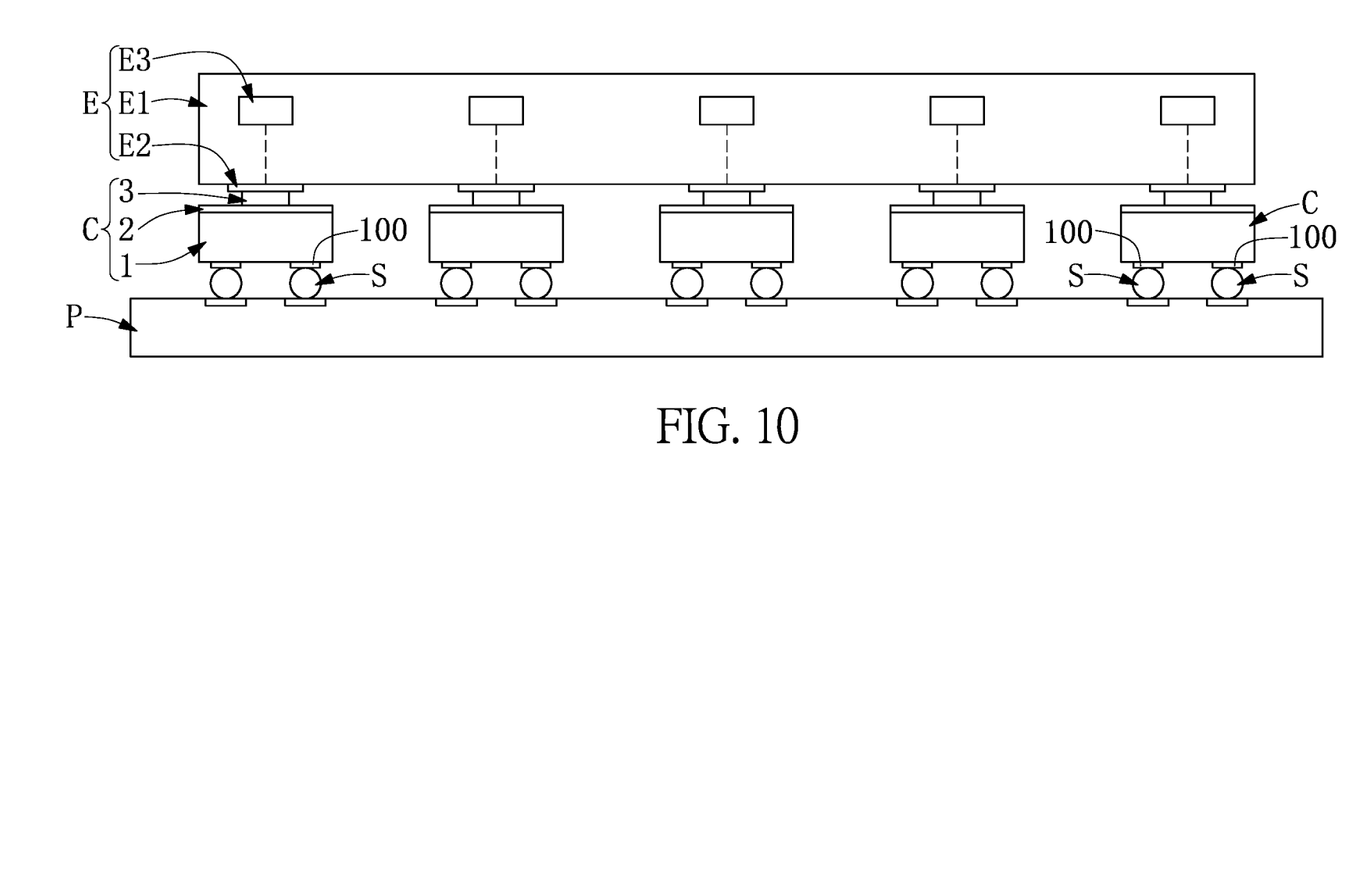
FIG. 10 is a schematic view of a step S102 of the chip transferring method according to the first embodiment of the present disclosure.
Figure 11:
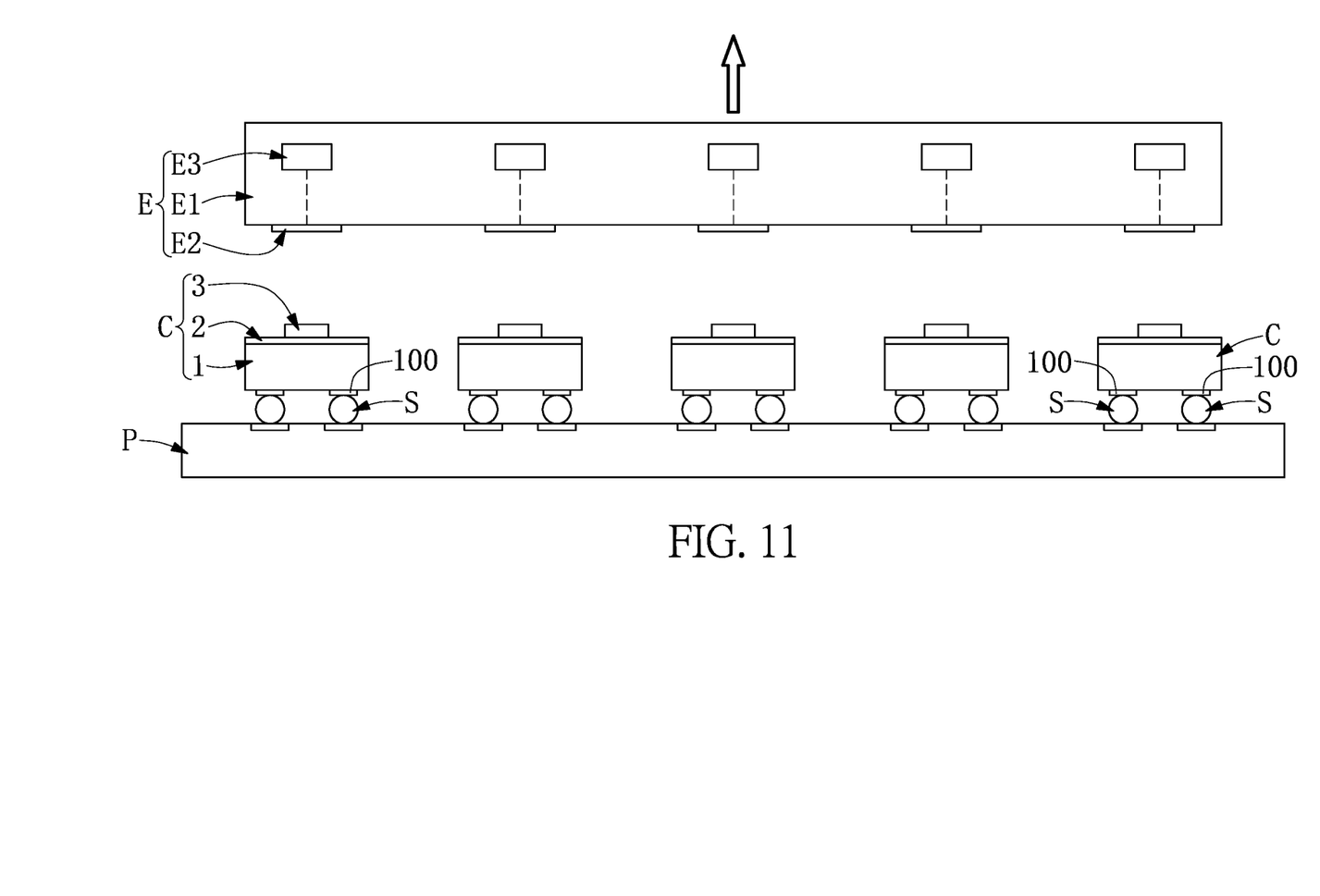
FIG. 11 is a schematic view of a step S104 of the chip transferring method according to the first embodiment of the present disclosure.
Figure 12:
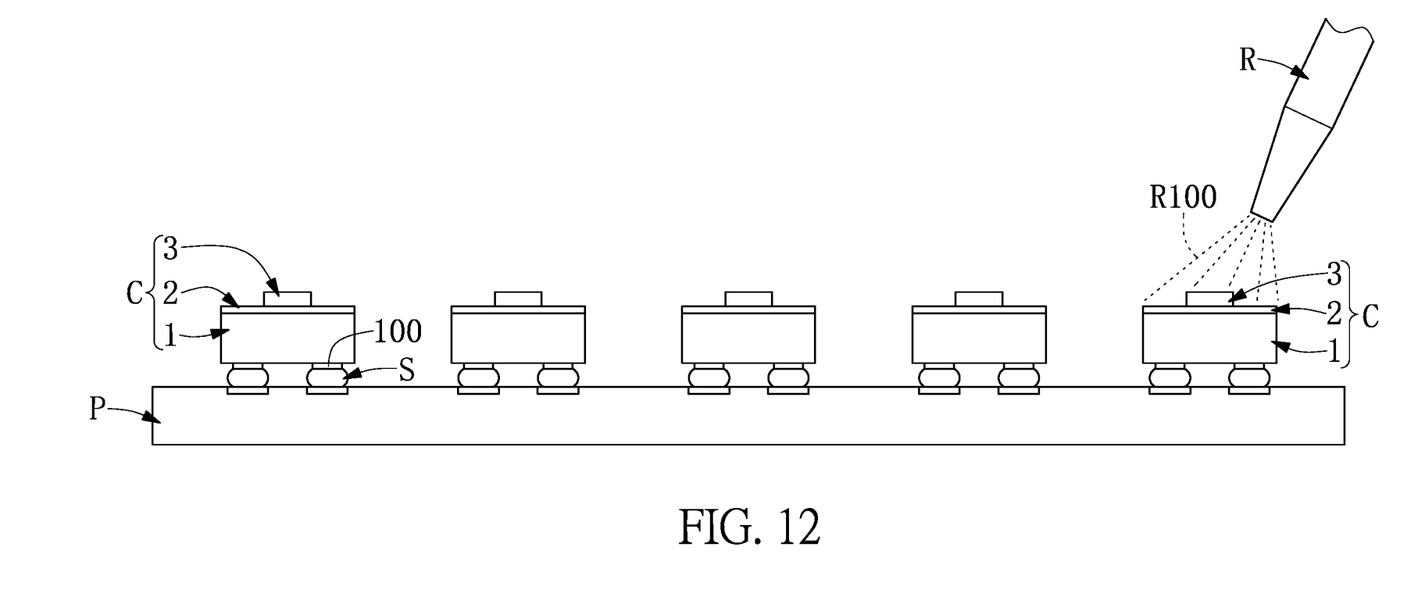
FIG. 12 is a schematic view of a step S106 of the chip transferring method according to the first embodiment of the present disclosure.
Figure 13:
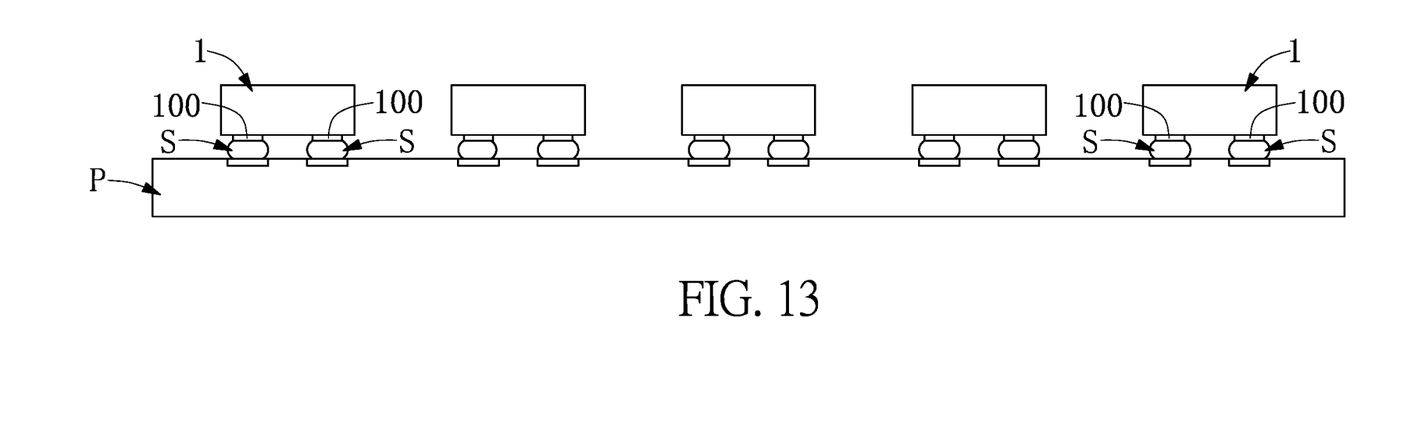
FIG. 13 is a schematic view of the LED chip structure without a removable connection layer and a magnetic material layer according to the present disclosure.

Referring to FIG. 1 to FIG. 13, a first embodiment of the present disclosure provides a chip transferring method, including the following steps: firstly, referring to FIG. 1 and FIG. 2, randomly distributing a plurality of LED chip structures C in a liquid substance L of a liquid receiving tank G, wherein each of the LED chip structures C includes an LED chip 1, a magnetic material layer 3 and a removable connection layer 2 connected between the LED chip 1 and the magnetic material layer 3 (step S100); next, referring to FIG. 1 and FIG. 8 to FIG. 10, transferring the LED chip structure C from the liquid receiving tank G onto a circuit substrate P by absorption of the electromagnetic field generating module E (step S102); afterwards, referring to FIG. 1, FIG. 10 and FIG. 11, electrically connecting the LED chip 1 to the circuit substrate P (step S104); and then referring to FIG. 1, FIG. 12 and FIG. 13, removing the removable connection layer 2 by the connection layer removing module R so as to separate the magnetic material layer 3 from the LED chip 1 (step S106).

Figure 6:
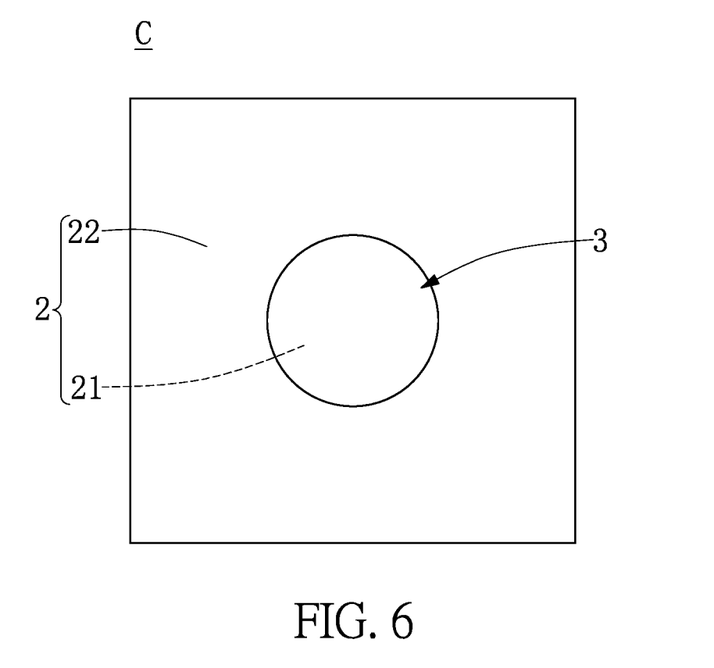
FIG. 6 is a top schematic view of the LED chip structure according to the first embodiment of the present disclosure.

For example, referring to FIG. 2 and FIG. 6, the LED chip 1 has two electrode contacts 100 disposed on a top side thereof, the removable connection layer 2 is disposed on a bottom side of the LED chip 1, and the magnetic material layer 3 is disposed on the removable connection layer 2. More particularly, the bottom side of the LED chip 1 is fully covered by the removable connection layer 2, and the removable connection layer 2 has a covering portion 21 covered by the magnetic material layer 3 and an exposing portion 22 exposed outside the magnetic material layer 3. Moreover, a center of gravity of the LED chip structure C is located on the LED chip 1 and is close to the two electrode contacts 100 of the LED chip 1. Therefore, when the LED chip structures C are randomly distributed in the liquid substance L (such as water or any blending fluid including water) of the liquid receiving tank G, the liquid substance L can be shocked or rocked by a shock wave (or other external force), so that the larger part of the LED chip 1 would be sank into the liquid substance L due to the center of gravity of the LED chip structure C, and the magnetic material layer 3 would be fully or partially exposed outside the liquid substance L (that is to say, when the LED chip structures C are randomly distributed in the liquid substance L of the liquid receiving tank G, the magnetic material layer 3 is fully or partially exposed outside the liquid substance L). However, the aforementioned description is merely an example and is not meant to limit the scope of the present disclosure.

Figure 3:
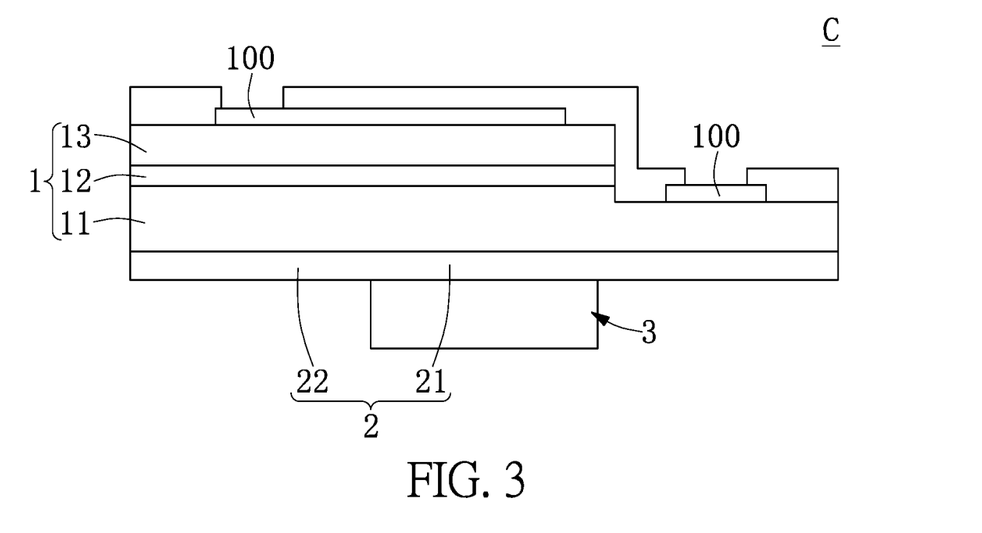
FIG. 3 is a schematic view of an LED chip structure according to the present disclosure.

For example, referring to FIG. 3, the LED chip 1 may be a micro LED without a base layer, and the micro LED includes a p-type semiconductor layer 11, a light-emitting layer 12 disposed on the p-type semiconductor layer 11, and an n-type semiconductor layer 13 disposed on the light-emitting layer 12, and the two electrode contacts 100 of the LED chip 1 are electrically connected to the p-type semiconductor layer 11 and the n-type semiconductor layer 13, respectively. However, the aforementioned description is merely an example and is not meant to limit the scope of the present disclosure.

Figure 4:
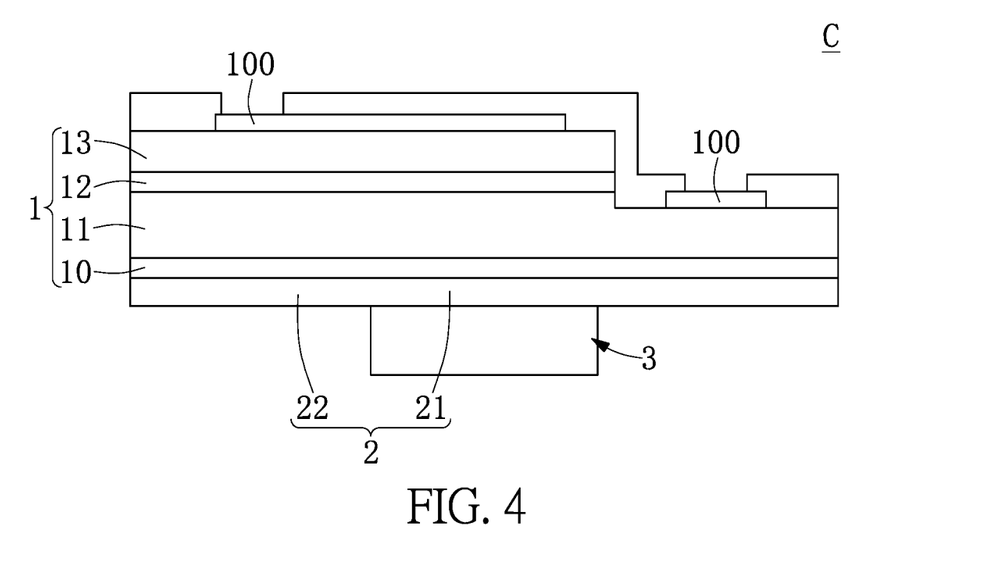
FIG. 4 is a schematic view of another LED chip structure according to the present disclosure.

For example, referring to FIG. 4, the LED chip 1 may be a mini LED, and the mini LED includes a base layer 10, a p-type semiconductor layer 11 disposed on the base layer 10, a light-emitting layer 12 disposed on the p-type semiconductor layer 11, and an n-type semiconductor layer 13 disposed on the light-emitting layer 12, and the two electrode contacts 100 of the LED chip 1 are electrically connected to the p-type semiconductor layer 11 and the n-type semiconductor layer 13, respectively. However, the aforementioned description is merely an example and is not meant to limit the scope of the present disclosure.

Figure 5:
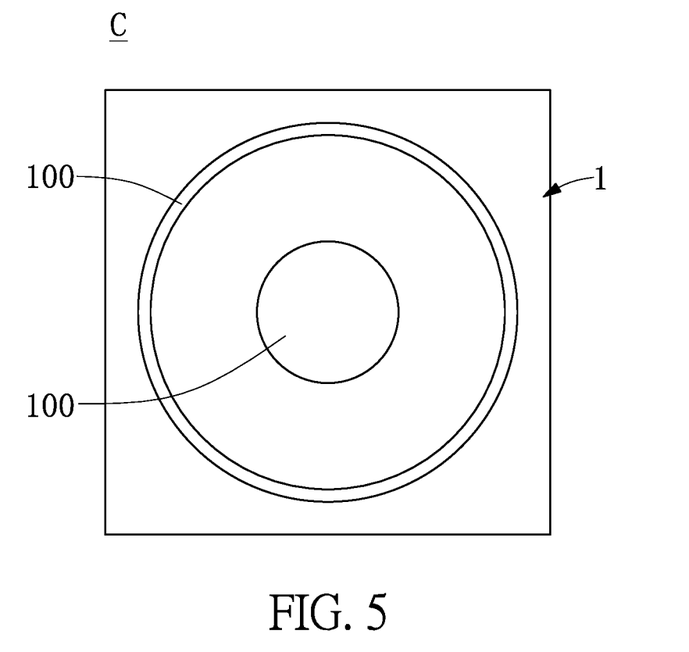
FIG. 5 is a schematic view of yet another LED chip structure according to the present disclosure.

For example, referring to FIG. 5, one of the two electrode contacts 100 is surrounded by another one of the two electrode contacts 100, one of the two electrode contacts 100 (such as an inner electrode contact 100 as shown in FIG. 5) may be a p-type conductive contact (not shown), and another one of the two electrode contacts 100 (such as an outer electrode contact 100 as shown in FIG. 5) may be an n-type conductive contact (not shown). However, the aforementioned description is merely an example and is not meant to limit the scope of the present disclosure.

Figure 7:
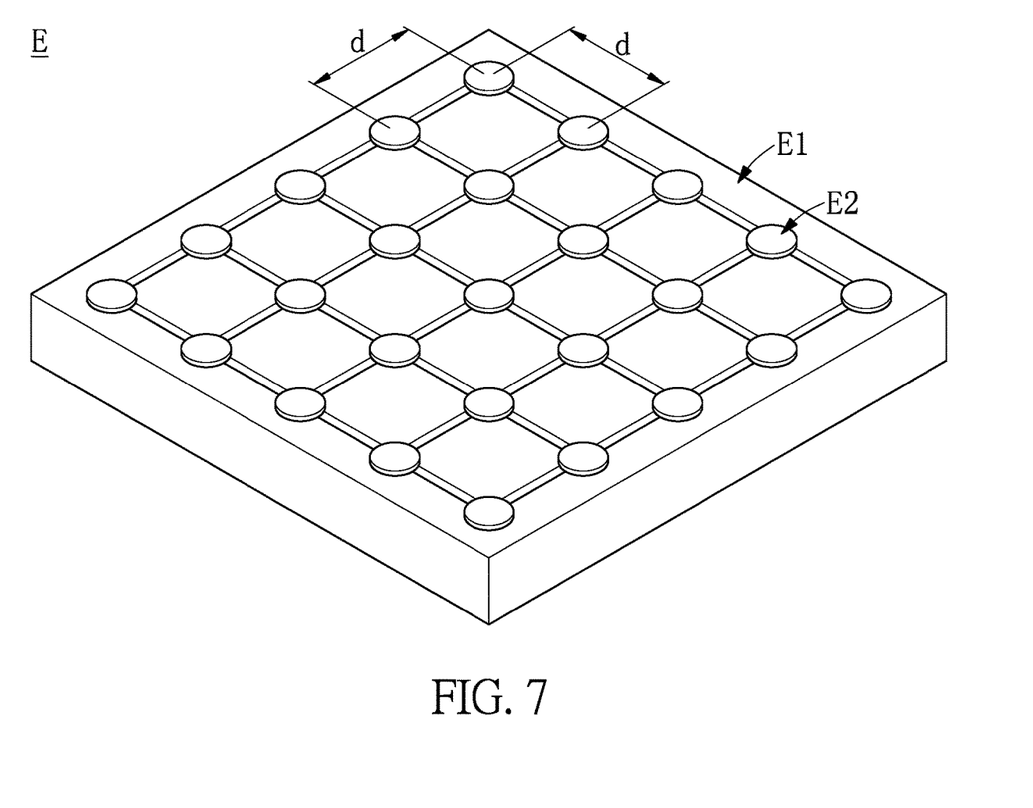
FIG. 7 shows a perspective schematic view of an electromagnetic field generating module according to the present disclosure.

For example, referring to FIG. 2, FIG. 7 and FIG. 8, the electromagnetic field generating module E includes a movable carrier board E1 and a plurality of electromagnetic heads E2 disposed on the movable carrier board E1, and the electromagnetic field generating module E is movably disposed inside the liquid receiving tank G (as shown in FIG. 8) or removed from the liquid receiving tank G (as shown in FIG. 2). More particularly, as shown in FIG. 8, after the electromagnetic field generating module E is disposed inside the liquid receiving tank G, the LED chip structure C can be captured or absorbed by the corresponding electromagnetic head E2 due to the corresponding magnetic material layer 3. Referring to FIG. 9 and FIG. 10, after the electromagnetic field generating module E is removed from the liquid receiving tank G, the LED chip structure C that has been captured or absorbed by the corresponding electromagnetic head E2 can be transferred onto the circuit substrate P by the movable carrier board E1, and the two electrode contacts 100 of the LED chip 1 can be electrically connected to the circuit substrate P through two solder balls S respectively (such as by reflow soldering method or laser heating method). Referring to FIG. 12 and FIG. 13, after the two electrode contacts 100 of the LED chip 1 are electrically connected to the circuit substrate P, the removable connection layer 2 (such as a photoresist layer that can be made of any light sensitive material) can be removed by a photoresist-stripping solution R100 (such as an organic solvent or an inorganic solvent) provided from the connection layer removing module R (such as a photoresist-stripping solution generating device) so as to separate the magnetic material layer 3 from the LED chip 1. That is to say, the removable connection layer 2 is connected between the LED chip 1 and the magnetic material layer 3, so that when the removable connection layer 2 is removed, the magnetic material layer 3 can be separated from the LED chip 1 following the removal of the removable connection layer 2. However, the aforementioned description is merely an example and is not meant to limit the scope of the present disclosure.

For example, as shown in FIG. 2, the electromagnetic field generating module E includes a plurality of power control switches E3, and the power control switch E3 may be a CMOS switch or a MEMS switch. In addition, the power control switches E3 are respectively electrically connected to the electromagnetic heads E2, and each of the electromagnetic head E2 can be turned on to generate a magnetic force by the corresponding power control switch E3 or can be turned off to eliminate the magnetic force by the corresponding power control switch E3 (that is to say, each of the electromagnetic head E2 can be turned on or off by controlling the corresponding power control switch E3). In another embodiment, all of the electromagnetic heads E2 or most of the electromagnetic heads E2 can be turned on or off by a single power control switch E3. Moreover, referring to FIG. 2 and FIG. 7, the electromagnetic heads E2 can be arranged as a matrix, and each of the electromagnetic heads E2 can be movably disposed on the movable carrier board E1 or fixedly disposed on the movable carrier board E1. When each of the electromagnetic heads E2 can be movably disposed on the movable carrier board E1, a distance between any two of the electromagnetic heads E2 is adjusted. That is to say, referring to FIG. 2 and FIG. 7, when a distance between two adjacent LED chips 1 needs to be adjusted, the distance (d) between two adjacent electromagnetic heads E2 can be adjusted along tracks according to the distance between the two adjacent LED chips 1, so that the distance between the two adjacent LED chips 1 should be equal to the distance (d) between the two adjacent electromagnetic heads E2. However, the aforementioned description is merely an example and is not meant to limit the scope of the present disclosure.

Second Embodiment

Referring to FIG. 2 to FIG. 13, a second embodiment of the present disclosure provides a chip transferring system, including a liquid receiving tank G, an electromagnetic field generating module E and a connection layer removing module R.

More particularly, as shown in FIG. 2, the liquid receiving tank G has a liquid substance L disposed therein, and a plurality of LED chip structures C can be randomly distributed in the liquid substance L of the liquid receiving tank G. Each of the LED chip structures C includes an LED chip 1, a removable connection layer 2 and a magnetic material layer 3. The LED chip 1 has two electrode contacts 100 disposed on a top side thereof, the removable connection layer 2 is disposed on a bottom side of the LED chip 1, and the magnetic material layer 3 is disposed on the removable connection layer 2.

More particularly, referring to FIG. 2 and FIG. 8, the electromagnetic field generating module E includes a movable carrier board E1 and a plurality of electromagnetic heads E2 disposed on the movable carrier board E1. In addition, the electromagnetic field generating module E can be movably disposed inside the liquid receiving tank G or removed from the liquid receiving tank G, and the LED chip structure C can be transferred from the liquid receiving tank G onto a circuit substrate P by the electromagnetic field generating module E.

More particularly, referring to FIG. 12 and FIG. 13, the connection layer removing module R is disposed above the circuit substrate P. For example, after the two electrode contacts 100 of the LED chip 1 are electrically connected to the circuit substrate P, the removable connection layer 2 (such as a photoresist layer that can be made of any light sensitive material) can be removed by a photoresist-stripping solution R100 (such as an organic solvent or an inorganic solvent) provided from the connection layer removing module R (such as a photoresist-stripping solution generating device) so as to separate the magnetic material layer 3 from the LED chip 1. That is to say, the removable connection layer 2 is connected between the LED chip 1 and the magnetic material layer 3, so that when the removable connection layer 2 is removed, the magnetic material layer 3 can be separated from the LED chip 1 following the removal of the removable connection layer 2. However, the aforementioned description is merely an example and is not meant to limit the scope of the present disclosure.

For example, as shown in FIG. 2, the electromagnetic field generating module E includes a plurality of power control switches E3, and the power control switch E3 may be a CMOS switch or a MEMS switch. In addition, the power control switches E3 are respectively electrically connected to the electromagnetic heads E2, and each of the electromagnetic head E2 can be turned on to generate a magnetic force by the corresponding power control switch E3 or can be turned off to eliminate the magnetic force by the corresponding power control switch E3 (that is to say, each of the electromagnetic head E2 can be turned on or off by controlling the corresponding power control switch E3). In another embodiment, all of the electromagnetic heads E2 or most of the electromagnetic heads E2 can be turned on or off by a single power control switch E3. Moreover, referring to FIG. 2 and FIG. 7, the electromagnetic heads E2 can be arranged as a matrix, and each of the electromagnetic heads E2 can be movably disposed on the movable carrier board E1 or fixedly disposed on the movable carrier board E1. When each of the electromagnetic heads E2 can be movably disposed on the movable carrier board E1, a distance between any two of the electromagnetic heads E2 is adjusted. That is to say, referring to FIG. 2 and FIG. 7, when a distance between two adjacent LED chips 1 needs to be adjusted, the distance (d) between two adjacent electromagnetic heads E2 can be adjusted along tracks according to the distance between the two adjacent LED chips 1, so that the distance between the two adjacent LED chips 1 should be equal to the distance (d) between the two adjacent electromagnetic heads E2. However, the aforementioned description is merely an example and is not meant to limit the scope of the present disclosure.

In conclusion, by virtue of "the removable connection layer 2 being disposed on a bottom side of the LED chip 1" and "the magnetic material layer 3 being disposed on the removable connection layer 2", the magnetic material layer 3 can be separated from the LED chip 1 while the removable connection layer 2 is removed.

Furthermore, by virtue of "the LED chip structures C being randomly distributed in the liquid substance L of the liquid receiving tank G", "the electromagnetic field generating module E being movably disposed inside the liquid receiving tank G or removed from the liquid receiving tank G" and "the connection layer removing module R being disposed above the circuit substrate P", the LED chip structure C can be transferred from the liquid receiving tank G onto a circuit substrate P by the electromagnetic field generating module E, and the magnetic material layer 3 can be separated from the LED chip 1 while the removable connection layer 2 is removed by the connection layer removing module R.

Furthermore, by virtue of "randomly distributing a plurality of LED chip structures C in a liquid substance L of a liquid receiving tank G", "transferring the LED chip structure C from the liquid receiving tank G onto a circuit substrate P by the electromagnetic field generating module E", "electrically connecting the LED chip 1 to the circuit substrate P" and "removing the removable connection layer 2 by the connection layer removing module R so as to separate the magnetic material layer 3 from the LED chip 1", the LED chip structure C can be transferred from the liquid receiving tank G onto a circuit substrate P by the electromagnetic field generating module E, and the magnetic material layer 3 can be separated from the LED chip 1 while the removable connection layer 2 is removed by the connection layer removing module R.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED chip structure, comprising:
an LED chip having two electrode contacts disposed on a top side thereof;
a removable connection layer disposed on a bottom side of the LED chip; and
a magnetic material layer disposed on the removable connection layer;
wherein the removable connection layer is connected between the LED chip and the magnetic material layer, so that when the removable connection layer is removed, the magnetic material layer is separated from the LED chip.

2. The LED chip structure according to claim 1, wherein the LED chip is a micro LED without a base layer, and the micro LED includes a p-type semiconductor layer, a light-emitting layer disposed on the p-type semiconductor layer, and an n-type semiconductor layer disposed on the light-emitting layer; wherein the bottom side of the LED chip is fully covered by the removable connection layer, and the removable connection layer has a covering portion covered by the magnetic material layer and an exposing portion exposed outside the magnetic material layer; wherein a center of gravity of the LED chip structure is located on the LED chip and is close to the two electrode contacts.

3. The LED chip structure according to claim 1, wherein the LED chip is a mini LED, and the mini LED includes a base layer, a p-type semiconductor layer disposed on the base layer, a light-emitting layer disposed on the p-type semiconductor layer, and an n-type semiconductor layer disposed on the light-emitting layer; wherein the bottom side of the LED chip is fully covered by the removable connection layer, and the removable connection layer has a covering portion covered by the magnetic material layer and an exposing portion exposed outside the magnetic material layer; wherein a center of gravity of the LED chip structure is located on the LED chip and is close to the two electrode contacts.

4. The LED chip structure according to claim 1, wherein one of the two electrode contacts is surrounded by another one of the two electrode contacts, one of the two electrode contacts is a p-type conductive contact, and another one of the two electrode contacts is an n-type conductive contact; wherein the bottom side of the LED chip is fully covered by the removable connection layer, and the removable connection layer has a covering portion covered by the magnetic material layer and an exposing portion exposed outside the magnetic material layer; wherein a center of gravity of the LED chip structure is located on the LED chip and is close to the two electrode contacts.

5. A chip transferring system, comprising:
a liquid receiving tank having a liquid substance disposed therein, wherein a plurality of LED chip structures are randomly distributed in the liquid substance of the liquid receiving tank;
an electromagnetic field generating module movably disposed inside the liquid receiving tank or removed from the liquid receiving tank, wherein the electromagnetic field generating module includes a movable carrier board and a plurality of electromagnetic heads disposed on the movable carrier board, and the LED chip structure is transferred from the liquid receiving tank onto a circuit substrate by the electromagnetic field generating module; and
a connection layer removing module disposed above the circuit substrate;
wherein each of the LED chip structures includes an LED chip, a removable connection layer and a magnetic material layer, the LED chip has two electrode contacts disposed on a top side thereof, the removable connection layer is disposed on a bottom side of the LED chip, and the magnetic material layer is disposed on the removable connection layer.

6. The chip transferring system according to claim 5, wherein after the electromagnetic field generating module is disposed inside the liquid receiving tank, the LED chip structure is captured by the corresponding electromagnetic head due to the corresponding magnetic material layer; wherein after the electromagnetic field generating module is removed from the liquid receiving tank, the LED chip structure that has been captured by the corresponding electromagnetic head is transferred onto the circuit substrate by the movable carrier board; wherein after the two electrode contacts of the LED chip are electrically connected to the circuit substrate, the removable connection layer is removed by the connection layer removing module so as to separate the magnetic material layer from the LED chip.

7. The chip transferring system according to claim 5, wherein the electromagnetic field generating module includes a plurality of power control switches respectively electrically connected to the electromagnetic heads, and each of the electromagnetic head is turned on to generate a magnetic force by the corresponding power control switch or is turned off to eliminate the magnetic force by the corresponding power control switch; wherein the electromagnetic heads are arranged as a matrix, and each of the electromagnetic heads is movably disposed on the movable carrier board so as to adjust a distance between any two of the electromagnetic heads; wherein the removable connection layer is a photoresist layer, and the connection layer removing module is a photoresist-stripping solution generating device.

8. A chip transferring method, comprising:
randomly distributing a plurality of LED chip structures in a liquid substance of a liquid receiving tank, wherein each of the LED chip structures includes an LED chip, a magnetic material layer and a removable connection layer connected between the LED chip and the magnetic material layer;
transferring the LED chip structure from the liquid receiving tank onto a circuit substrate by the electromagnetic field generating module;
electrically connecting the LED chip to the circuit substrate; and
removing the removable connection layer by the connection layer removing module so as to separate the magnetic material layer from the LED chip.

9. The chip transferring method according to claim 8, wherein the electromagnetic field generating module includes a movable carrier board and a plurality of electromagnetic heads disposed on the movable carrier board, and the electromagnetic field generating module is movably disposed inside the liquid receiving tank or removed from the liquid receiving tank; wherein the LED chip has two electrode contacts disposed on a top side thereof, the removable connection layer is disposed on a bottom side of the LED chip, and the two electrode contacts of the LED chip are electrically connected to the circuit substrate through two solder balls respectively; wherein the removable connection layer is a photoresist layer, and the connection layer removing module is a photoresist-stripping solution generating device.

10. The chip transferring method according to claim 9, wherein when the LED chip structures are randomly distributed in the liquid substance of the liquid receiving tank, the magnetic material layer is fully or partially exposed outside the liquid substance; wherein the bottom side of the LED chip is fully covered by the removable connection layer, and the removable connection layer has a covering portion covered by the magnetic material layer and an exposing portion exposed outside the magnetic material layer; wherein a center of gravity of the LED chip structure is located on the LED chip and is close to the two electrode contacts.

* * * * *